(12) United States Patent
Byrne et al.

(10) Patent No.: US 10,312,930 B1
(45) Date of Patent: Jun. 4, 2019

(54) ADC DIGITAL GAIN ERROR COMPENSATION

(71) Applicant: Analog Devices Global Unlimited Company, Hamilton (BM)

(72) Inventors: Eamonn J. Byrne, Limerick (IE); Jesus Bonache, Mutxamel (ES); Andrejs Tunkels, Carrigaline (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/880,010

(22) Filed: Jan. 25, 2018

(51) Int. Cl.
  *H03M 1/06* (2006.01)
  *H03M 1/18* (2006.01)
  *H03F 3/217* (2006.01)

(52) U.S. Cl.
  CPC .......... *H03M 1/183* (2013.01); *H03F 3/2175* (2013.01); *H03M 1/06* (2013.01)

(58) Field of Classification Search
  CPC ...... H03M 1/066; H03M 1/0604; H03M 1/18; H03M 1/06; H03M 1/12; H03M 1/203; H03M 1/207; H03M 1/10; H03M 1/1009; H03M 1/1071; H03M 2201/63; H03M 3/38
  USPC .......... 341/118, 155, 119, 117, 120
  See application file for complete search history.

(56) References Cited

U.S. PATENT DOCUMENTS

| | | | | |
|---|---|---|---|---|
| 6,822,600 B1* | 11/2004 | Taft | ........................ | H03M 1/089 341/155 |
| 7,075,474 B2* | 7/2006 | Yamagata | ........... | H03M 1/0619 341/155 |
| 7,843,369 B2* | 11/2010 | Takahashi | ........... | H03M 1/1033 341/118 |
| 9,444,665 B2 | 9/2016 | Chou et al. | | |
| 2014/0159930 A1* | 6/2014 | Ho | .......................... | H03M 3/32 341/143 |
| 2016/0142068 A1* | 5/2016 | Oshima | ............... | H03M 1/1038 341/118 |

OTHER PUBLICATIONS

Texas Instruments, "ADS8588S Data Sheet"; Dec. 2016, Revised Apr. 2017.

* cited by examiner

*Primary Examiner* — Jean B Jeanglaude
(74) *Attorney, Agent, or Firm* — Schwegman Lundberg & Woessner, P.A.

(57) ABSTRACT

Techniques are provided for compensating gain of a combined amplifier and analog-to-digital converter (ADC) circuit, for example, due to additional filtering added to an input of the circuit. In an example, an integrated circuit including an amplifier and ADC can include an amplifier circuit configured to receive an input signal and to amplify the input signal based on an input resistance and a feedback resistance, and to provide an amplified representation of the input signal, and an ADC circuit configured to receive an output of the amplifier, to determine a digital coefficient associated with an additional input resistance coupled to the amplifier, and to provide a compensated digital representation of the amplified representation of the input signal using the digital compensation coefficient.

20 Claims, 2 Drawing Sheets

ADC DIGITAL GAIN ERROR COMPENSATION

BACKGROUND

Analog-to-digital converters can often employ an amplifier to assist in scaling an input signal to the sensing range of the ADC. Users of parts including an amplifier and ADC combination may also use filtering external to the part. Such filtering can corrupt the anticipated gain of the amplifier.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As the digital age has evolved, data acquisition, digital conversion and computer analysis of the collected data has become commonplace. A common architecture for collecting analog data can include an analog-to-digital converter (ADC). Such an architecture can often include an input amplifier to receive the raw signal and amplify or attenuate the signal to scale the range of the signal with the range of the ADC. However, users can often employ a circuit external to the amplifier and ADC combination part. Such an external component can be used to protect the amplifier and ADC combination part from transients that may occur with the signal or to filter out certain features of the signal. Unfortunately, such external components can also affect the gain of the amplifier and thus, the useable range of the ADC. One technique of preventing such corruption of the amplifier gain is to use a buffer before the amplifier. However, a buffer can also require a supply that can span the range of the raw signal making such a solution unpractical in many applications. Another solution is to measure the gain corruption or gain error and provide some other external software or hardware circuit to compensate for the gain error.

The present inventors have recognized new techniques for compensating for gain error in an integrated amplifier and ADC circuit, the combined ADC circuit. The techniques apply a digital gain to the output of the ADC of the combined ADC circuit to compensate for gain error, or gain corruption, of the amplifier of the combined ADC circuit due to, for example, input filtering of the input signal. In certain examples, a user interface of the combined ADC circuit can be provided to enter a characteristic of the external filter. Characteristics of the combined ADC circuit that can be saved during production can be processed with the received characteristic of the external filter to provide a compensation gain for the digital output of the combined ADC circuit.

Figure 1:
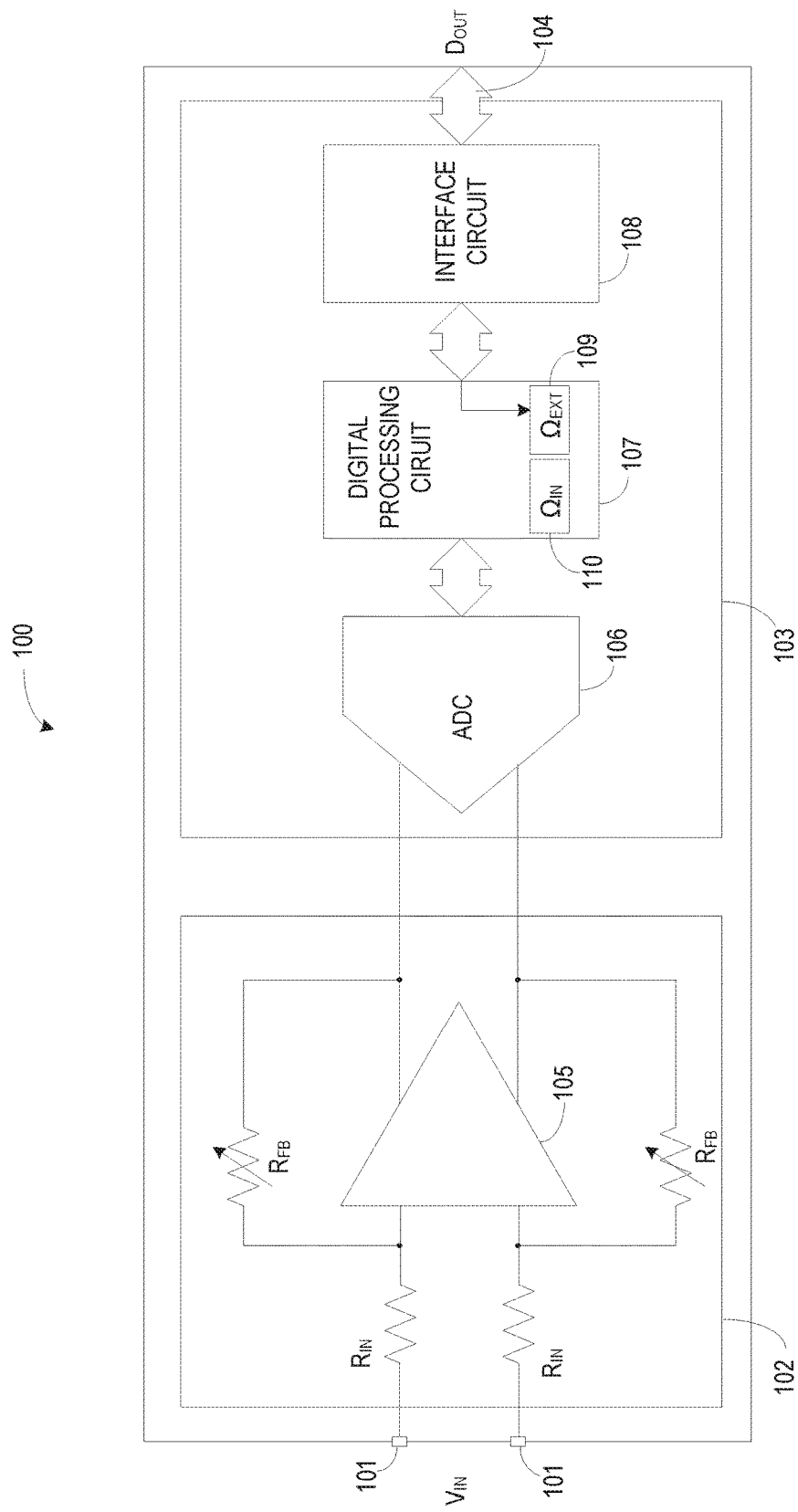
FIG. 1 illustrates generally an example of a combined ADC circuit according to various aspects of the present subject matter.

FIG. 1 illustrates generally an example of a combined ADC circuit 100 according to various embodiments of the present subject matter. In certain examples, the combined ADC circuit 100 can include input terminals 101, an amplifier circuit 102, an ADC circuit 103 and one or more ports 104. The amplifier circuit 102 can include one or more input resistors ($R_{IN}$), one or more feedback resistors ($R_{FB}$), and an amplifier 105. The ADC circuit 103 can include an ADC 106, a digital processing circuit 107, and an interface circuit 108. The input terminals 101 can receive the input signal ($V_{IN}$). In certain examples, the input terminals 101 can be configured to receive a differential signal. In some examples, the input terminals 101 can be configured to receive a single-ended signal. The amplifier circuit 102 can scale the input signal ($V_{IN}$) to provide an analog signal to the input of the ADC 106 with a desired range. In certain examples, the one or more input resistors ($R_{IN}$) can be fixed. In some examples, the one or more feedback resistors ($R_{FB}$) can be adjustable. In some examples, an adjustable resistor can be formed using a resistor network and one or more transistors programmed via the interface circuit 108 to select a particular resistance value such as a particular input resistance ($\Omega_{IN}$) or a particular feedback resistance ($\Omega_{FB}$). Having at least one of the one or more input resistors ($R_{IN}$) or the one or more feedback resistors ($R_{FB}$) adjustable, or programmable, can allow a user to select a desired gain (G) of the amplifier. In certain examples, the gain (G) of the amplifier can be represented as, $$G = \frac{\Omega_{FB}}{\Omega_{IN}}, \tag{Eq. 1}$$

where $\Omega_{FB}$ is the resistance of the feedback resistor ($R_{FB}$) and $\Omega_{IN}$ is the resistance of the input resistor ($R_{IN}$). In some examples, one of either the input resistors ($R_{IN}$) or the feedback resistors ($R_{FB}$) can be programmable to select a gain (G) of the amplifier circuit 102 via a register of the ADC circuit 100. As used herein, a register can include one or more external pins of the combined ADC circuit 100 or a memory location that can be written to via the interface circuit 106.

The ADC 106 can receive the output of the amplifier 105 and can convert the signal to a digital value. In some examples, the ADC 106 can be a successive-approximation-register (SAR) ADC, however other types of ADCs are possible without departing from the scope of the present subject matter. In some examples, the combined ADC circuit 100 can include a filter between the output of the amplifier 105 and the input of the ADC 106. Such a filter can include a lowpass filter to remove high frequency components that are of little interest or have been induced by the high-speed operations of the ADC 106 or other component of the combined ADC circuit 100.

The digital processing circuit 107 can receive the output of the ADC 106 and can filter the digital output via a number of parameters. The digital processing circuit 107 can also monitor operation of the ADC 106, the amplifier 105 and other ancillary circuits of the combined ADC circuit 100 such as power supplies and protection circuitry, and can provide status indication of such operations and circuits. The digital processing circuit 107 can also include configuration and control information for the amplifier 105, ADC 106 and ancillary circuits. The digital processing circuit 107 can control operation of the combined ADC circuit 100 according to the options selected in the configuration and control information.

The interface circuit 108 can receive a digital representation of the input signal from the digital processing circuit 107 and provide the digital representation to the one or more digital ports 104. In some examples, the ADC 106 can include the digital processing circuit 107, or vice versa. The one or more digital ports can allow information to be exchanged with the combined ADC circuit 100. Such information can include the digital representation of the input signal (Dour), and the control and configuration information, and the status information about the operation of the combined ADC circuit 100. The one or more ports 104 can include, but are not limited to, discrete I/O terminals, parallel I/O terminals, serial communication terminals, wireless communications, or combination thereof FIG. 1 illustrates generally an integrated combined ADC circuit 100 with a single analog input channel. In some examples, an integrated circuit can include multiple analog input channels with a single digital processing circuit 107 and a single interface circuit 108. Each of the multiple analog input channels can include input terminals for receiving the associated input signal, an amplifier and associated input and feedback resistors, and an ADC. Each channel may also include optional clamp circuits for limiting extreme excursions of the input signal ($V_{IN}$), and filters as discussed above. For example, but not by way of limitation, a combined integrated ADC circuit can include 4, 6, 8, or 16 analog input channels.

In certain examples, a memory location 109 of the digital processing circuit 107, or the ADC 106, can receive, via the interface circuit 108, a representation of an external resistance ($\Omega_{EXT}$) coupled to the input terminals 101 of an analog input channel. As discussed above, a user can select to filter or attach some other analog processing circuit to pre-process or filter the input signal ($V_{IN}$). The additional circuitry can corrupt the desired gain of the amplifier circuit 102 by summing resistance with the input resistor ($R_{IN}$). The memory location 109 can be used to indicate an estimate of the added resistance. The digital processing circuit 107 or the ADC 106 can simply compensate for the gain corruption by manipulating the digital representation of the input circuit based on the value of the resistance ($\Omega_{EXT}$) represented by the state of the memory location 109.

In some examples, at the production of the combined ADC circuit 100, the resistance ($\Omega_{IN}$) of the input resistor ($R_{IN}$) can be saved in a second memory location 110 of the combined ADC circuit 100. The digital processing circuit 107 or the ADC 106 can then determine a digital compensation coefficient ($G_{comp}$) using the stored input resistance value ($\Omega_{IN}$) and an external resistance value ($\Omega_{EXT}$) received for any additional resistance added to the input of the analog input channel, such that, $$G_{comp} = \frac{(\Omega_{IN} + \Omega_{EXT})}{\Omega_{IN}} \qquad \text{Eq. 2}$$

The digital compensation coefficient ($G_{comp}$) can then be used to adjust the digital output of the combined ADC circuit 100. For example, the gain (G) of the amplifier with the additional external resistance ($\Omega_{EXT}$) can be, $$G = \frac{\Omega_{FB}}{(\Omega_{IN} + \Omega_{EXT})}. \qquad \text{Eq. 3}$$

Thus, the uncompensated digital output ($D_{OUT\_UC}$) of the ADC 106 can be, $$D_{OUT\_UC} = V_{IN} G = \frac{V_{IN} \Omega_{FB}}{(\Omega_{IN} + \Omega_{EXT})}. \qquad \text{Eq. 4}$$

Multiplying the uncompensated digital output by the digital compensation coefficient ($G_{comp}$) provides, $$D_{OUT} = D_{OUT_{UC}} G_{comp} \qquad \text{Eq. 5}$$

$$= \frac{V_{IN} \Omega_{FB}}{(\Omega_{IN} + \Omega_{EXT})} \frac{(\Omega_{IN} + \Omega_{EXT})}{\Omega_{IN}} \qquad \text{Eq. 6}$$

$$= \frac{V_{IN} \Omega_{FB}}{\Omega_{IN}}, \qquad \text{Eq. 7}$$

where $V_{IN}$ is the input signal and $D_{OUT}$ is the output of the combined, integrated ADC circuit 100. Thus, the digital compensation provides the representation of the input signal ($V_{IN}$) with the gain expected based on the input resistors ($R_{IN}$) and the feedback resistors ($R_{FB}$), and without the user having to calculate the gain error as had been done in conventional systems.

Power generation and distribution sensors, as well as, general data acquisition applications can benefit from a combined amplifier and ADC integrated circuit as disclosed herein. In certain examples, having one of the input resistor or the feedback resistor programmable can allow the gain of the amplifier to be set to take advantage of as much of the input range of the ADC as possible. In some examples, the input resistance is fixed and the feedback resistance is programmable to allow a range of gains from less than 1 to greater than 1. In some examples, the input resistance can be about 1 mega ohm (Mohm) and the feedback resistance can be selectable from 3 or 4 or 5 or 6 or more settings. In some examples, the input resistance can be about 4.5 Mohm and the feedback resistance can be selectable from 3 or more settings.

Figure 2:
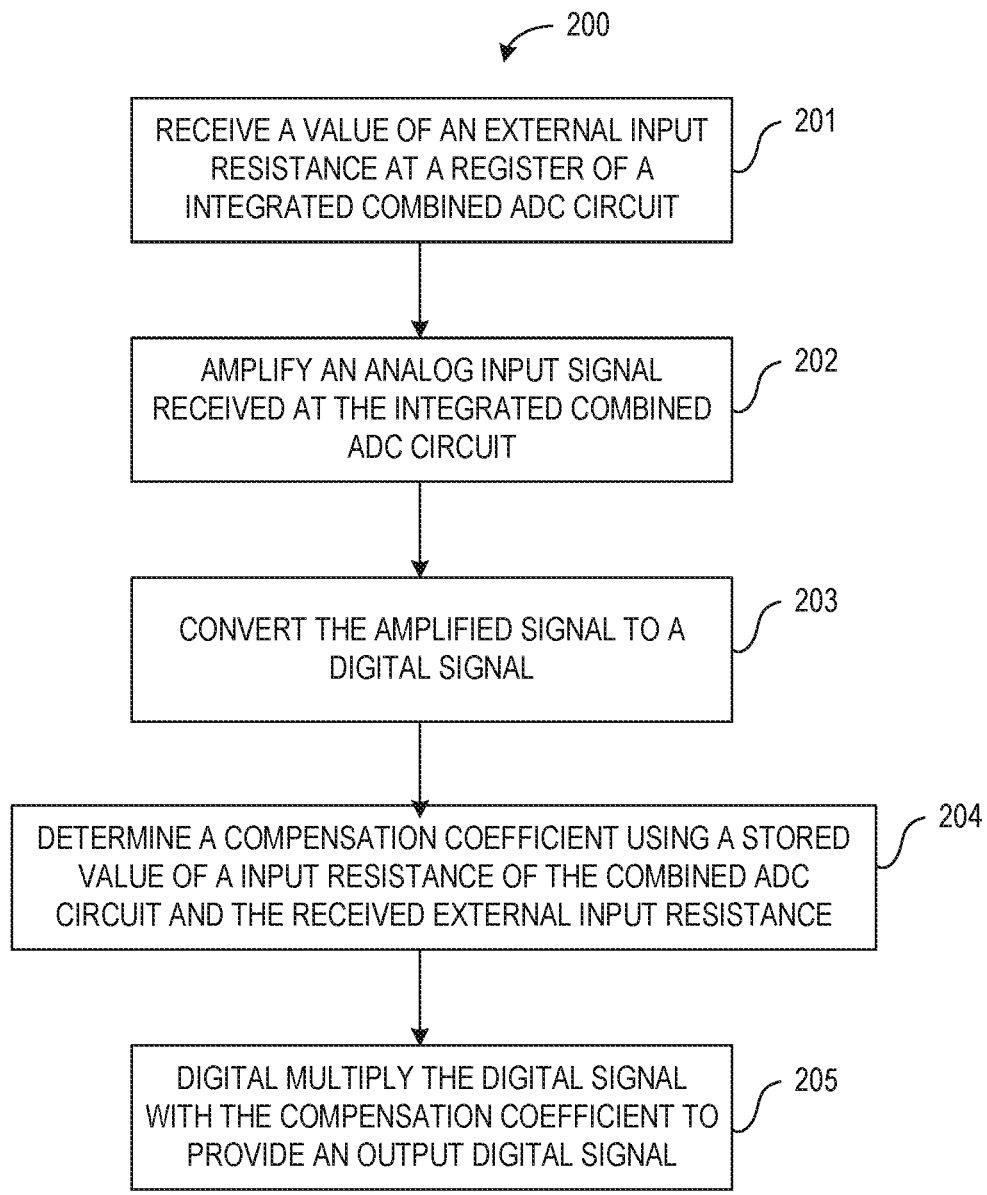
FIG. 2 illustrates generally a flowchart of an example method of operating a combined ADC circuit according to various aspects of the present subject matter.

FIG. 2 illustrates generally a flowchart of an example method 200 of operating a combined ADC circuit according to various examples of the present subject matter. At 201, a value of an external resistance coupled to an input channel of a combined ADC circuit can be received at a register of the combined ADC circuit. In some examples, a value of the external resistance can be selected form a plurality of predetermined values and the register can include the selection. At 202, an analog signal received at the combined ADC circuit can be amplified to provide an amplified analog signal. In certain examples again of an amplifier circuit can be selected using a ratio of an input resistance fabricated with the combined ADC circuit and a resistance of an adjustable feedback resistor of the combined ADC circuit. However, the actual gain of the amplifier of the combined ADC circuit can be affected by additional, external input resistance added to preprocess or filter the analog signal received at the combined ADC circuit. At 203, the amplified analog signal can be converted to an uncompensated digital signal. At 204, a compensation coefficient can be determined using a stored resistance value indicative of the input resistance of the combined ADC circuit and the user-entered and stored external input resistance value. In certain examples, the input resistance of the combined ADC circuit can be measured and stored at production of the combined ADC circuit and. At 205, the uncompensated digital signal can be digitally multiplied with the compensation coefficient to remove the effects of the external input resistance value on the amplifier gain and provide a digital signal representative of the input analog signal.

Various Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. An integrated circuit for compensating a gain error associated with an analog-to-digital converter (ADC), the integrated circuit comprising:
    an amplifier circuit configured to receive an input signal and to amplify the input signal based on an input resistance and a feedback resistance, and to provide an amplified representation of the input signal; and
    an ADC circuit configured to receive an output of the amplifier, to determine a digital coefficient associated with an additional input resistance coupled to the amplifier, and to provide a compensated digital representation of the amplified representation of the input signal using the digital compensation coefficient.

2. The integrated circuit of claim 1, including a memory location indicative of an input resistance of the amplifier circuit.

3. The integrated circuit of claim 1, wherein the amplifier circuit includes:
    an amplifier;
    an input resistor configured to couple the input signal to an input of the amplifier;
    an adjustable feedback resistor coupled between an output of the amplifier and the input to the amplifier.

4. The integrated circuit of claim 1, including a first register configured to store an indication of the additional input resistance.

5. The integrated circuit of claim 4, including a second register configured to store a setting for the feedback resistance.

6. The integrated circuit of claim 5, wherein the second register is a user-programmable register.

7. The integrated circuit of claim 4, wherein the ADC circuit includes a digital processing circuit configured to retrieve a first value of the first register, a second value of the memory location and to determine the digital coefficient.

8. The integrated circuit of claim 7, wherein the digital processing circuit is configured to digitally apply the digital coefficient to provide the compensated digital representation of the amplified representation of the input signal.

9. The integrated circuit of claim 7, wherein the ADC circuit includes the ADC; and
    wherein the digital processing circuit is configured to digitally multiply the digital coefficient with an output of the ADC to provide the compensated digital representation of the amplified representation of the input signal.

10. The integrated circuit of claim 1, including a first port configured to receive a setting for the feedback resistance.

11. The integrated circuit of claim 10, including a second port configured to receive user input indicative of the additional input resistance.

12. A method for compensating gain error of an analog-to-digital converter (ADC) circuit, the method comprising:

receiving an indication of an external resistance coupled to an input of a combined amplifier and ADC integrated circuit;

amplifying a received input signal of the combined amplifier and ADC integrated circuit;

converting the amplified signal to an uncompensated digital signal;

determining a compensation coefficient using the indication and a stored indication of an input resistance of the combined amplifier and ADC integrated circuit; and digitally multiplying the compensation coefficient with the uncompensated digital signal to provide an output of the combined amplifier and ADC integrated circuit.

13. The method of claim 12, including receiving a setting for a feedback resistance of an amplifier of the combined amplifier and ACD integrated circuit via a port of the combined amplifier and ACD integrated circuit.

14. The method of claim 13, including adjusting a switch to provide the feedback resistance associated with the setting.

15. The method of claim 12, wherein determining the compensation coefficient includes retrieving the indication of the external resistance from a first register and retrieving the stored indication of the input resistance from a second register.

16. The method of claim 15, wherein determining the compensation coefficient includes dividing a sum of the input resistance and the external resistance by the internal resistance.

17. A data acquisition system comprising:
an electrical apparatus;
an integrated analog-to-digital converter (ADC) circuit configured to receive a signal from the electrical apparatus and provide a digital representation of the signal; and
wherein the integrated ADC circuit includes:
an amplifier circuit configured to receive an input signal and to amplify the input signal based on an input resistance of the amplifier and a feedback resistance, and to provide an amplified representation of the input signal; and
an ADC circuit configured to receive an output of the amplifier, to determine a compensation coefficient associated with an additional input resistance coupled to the amplifier, and to provide a compensated digital representation of the amplified representation of the input signal using the compensation coefficient.

18. The data acquisition system of claim 17, including:
a first register configured to store an indication of the input resistance of the amplifier;
a second register configured to store a setting for the additional input resistance;
wherein the ADC circuit includes a digital processing circuit configured to retrieve a first value of the first register, a second value of the second register and to determine the compensation coefficient.

19. The data acquisition system of claim 18,
wherein the ADC circuit includes an ADC;
wherein the digital processing circuit is configured to digitally multiply the compensation coefficient with an output of the ADC to provide the compensated digital representation of the amplified representation of the input signal; and
wherein the compensation coefficient is equal to a sum divided by the first value, wherein the sum is equal to an addition of the first value with the second value.

20. The data acquisition system of claim 17, wherein the electrical apparatus includes a power generation and distribution sensor.

* * * * *